United States Patent [19]

Kitano

[11] 4,436,436
[45] Mar. 13, 1984

[54] DETECTION CIRCUIT FOR AN ELECTRONIC TIMEPIECE

[75] Inventor: Masuo Kitano, Matsumoto, Japan

[73] Assignees: Shimauchi Seiki Kabushiki Kaisha, Nagano; Kabushiki Kaisha Suwa Seikosha, Tokyo, both of Japan

[21] Appl. No.: 414,208

[22] Filed: Sep. 2, 1982

[30] Foreign Application Priority Data

Sep. 3, 1981 [JP] Japan .................................. 56-138909
Jun. 16, 1982 [JP] Japan .................................. 57-103625

[51] Int. Cl.³ .......................... G04B 1/00; H03K 17/22
[52] U.S. Cl. ....................................... 368/204; 307/585
[58] Field of Search ................................... 368/85–87, 368/155–156, 203–204; 307/247 A, 296 R–297, 585

[56] References Cited

U.S. PATENT DOCUMENTS

| | | | |
|---|---|---|---|
| 4,094,137 | 6/1978 | Morokawa | 368/204 |
| 4,103,187 | 7/1978 | Imamura | 368/203 |
| 4,173,862 | 11/1979 | Nakagiri et al. | 368/203 |
| 4,328,572 | 5/1982 | Kawahara | 368/204 |

Primary Examiner—Vit W. Miska
Attorney, Agent, or Firm—Blum, Kaplan, Friedman, Silberman and Beran

[57] ABSTRACT

A detection circuit for an electronic timepiece for ascertaining whether the power supply has been properly applied. A first switching element is in parallel with a capacitor and a second switching element is in series. A booster circuit raises the battery voltage to serve as a power source, which is applied to the series-connected capacitor and second switching element. When boosted voltage becomes higher than battery voltage, indicating that the power supply is properly applied, the first switching element is turned OFF and the second switching element is turned ON. If the battery is not properly applied, the first switching element is ON and the second switching element is OFF. The circuit is also suited to a timepiece with a voltage reduction circuit.

8 Claims, 7 Drawing Figures

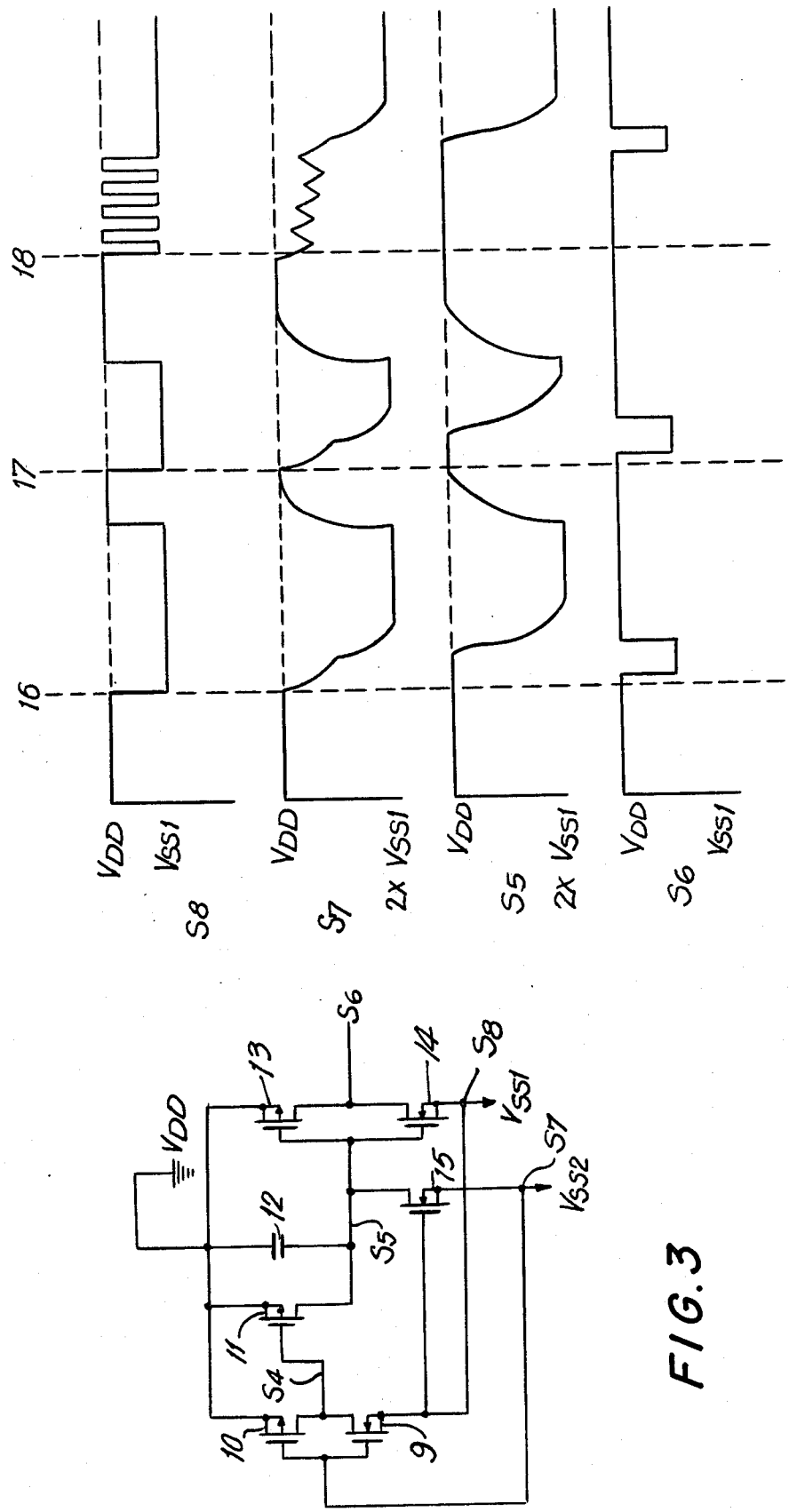

DETECTION CIRCUIT FOR AN ELECTRONIC TIMEPIECE

BACKGROUND OF THE INVENTION

This invention relates generally to a detection circuit for an electronic timepiece and more particularly to a detection circuit used to provide an indication when the power source is initially connected to the timepiece circuits. This indication assures that the battery is properly connected and the timekeeping circuits are functioning. In prior art circuits, an electrostatic capacitance is connected in series with a resistor. When the power source is applied, a current flows to charge the electrostatic capacitance through the resistance. At that time, it is determined whether the power source is connected or not connected by detecting an electric voltage signal at the connection point between the capacitance and the resistor.

However, the circuits of the prior art have the following defficiencies. Namely, when chattering is caused at the contact of the battery when the battery is applied, the output signal of electric voltage at the connection point between the capacitance and the resistor differs from the normal signal which should be produced when the power source is applied to the circuit without chatter. Thus, it is not always possible to properly detect whether the power source is or is not properly applied.

What is needed is a detection circuit for an electronic timepiece which provides a reliable indication of application of the power source even should chattering occur or the power be temporarily interrupted.

SUMMARY OF THE INVENTION

Generally speaking, in accordance with the invention, a detection circuit for an electronic timepiece especially suitable for ascertaining whether the power supply has been properly applied is provided. The level of the electrical potential at a connecting point between two switch elements in series, determines whether the power source is applied properly or not applied. Indirectly, operation or non-operation of the oscillation circuit in the timepiece when the power source is applied is also detected as an indication of the proper application of the power source. The two switch elements are controlled by the output voltage from a power circuit which operates only when the oscillator circuit operates. The power circuit may be a voltage boosting circuit, for example, a doubler, or the power circuit may be a voltage reduction circuit, for example, reducing the voltage of a power source to half. Because the detection circuit functions only when the power source is properly applied and the oscillator and voltage booster or reducer are operating, a reliable indication of the proper application of the battery source is assured.

Additionally, the detection circuit for an electronic timepiece in accordance with the invention consumes very little power because after the oscillation circuit commences operation by application of the power source, one of the two series switch elements is turned off. Thus, the detection circuit for an electronic timepiece in accordance with the invention is most suitable for an electronic timepiece using a small battery.

A first switching element is connected in parallel with a capacitor and a second switching element is connected in series with the capacitor. In a timepiece having a booster circuit which, for example, doubles the battery voltage to serve as a power source, the boosted voltage is applied to the series-connected capacitor and second switching element. When the boosted voltage becomes higher than the battery voltage, that is, when the circuits are operative, indicating that the power supply is properly applied, the first switching element is turned OFF and the second switching element is turned ON. On the other hand, if the so-called boosted voltage is less than the battery voltage, indicating that the battery is not properly applied, the first switching element is ON and the second switching element is OFF.

In a case where a voltage reduction circuit operates to reduce the battery voltage to serve as a power source, then the reduced voltage is placed across the series-connected capacitor and second switch element. If the reduced voltage is higher than a specific divided value of the battery voltage, the first switching element turns OFF and the second switching element turns ON. On the other hand, when the reduced voltage is less than the specific divided value of the battery voltage, the first switching element is ON and the second switching element is OFF. As the capacitor charges when the battery is properly applied, the output of the detection circuit is reversed, thereby providing an indication of proper battery application.

Accordingly, it is an object of this invention to provide an improved detection circuit for an electronic timepiece which reliably indicates proper application of a power source to a timepiece even when chattering occurs at the battery contacts or the battery is disconnected for a short time.

Another object of this invention is to provide an improved detection circuit for an electronic timepiece which consumes little power.

Still other objects and advantages of the invention will in part be obvious and will in part be apparent from the specification.

The invention accordingly comprises the features of construction, combination of elements and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 3 is a detection circuit for an electronic timepiece in accordance with the invention;

FIG. 4 illustrates timing waveforms associated with the circuit of FIG. 3;

DESCRIPTION OF THE PREFERRED EMBODIMENTS

This invention relates to a circuit for an electronic timepiece having two or more power sources with different voltages. The detection circuit for an electronic timepiece in accordance with the invention detects whether the power supply source is properly applied or has not been properly applied. Also, the circuit in accordance with the invention may detect whether the ocillation circuit of the timepiece is operating or non-operating as an indication of whether the power source has been properly applied.

Figure 1:
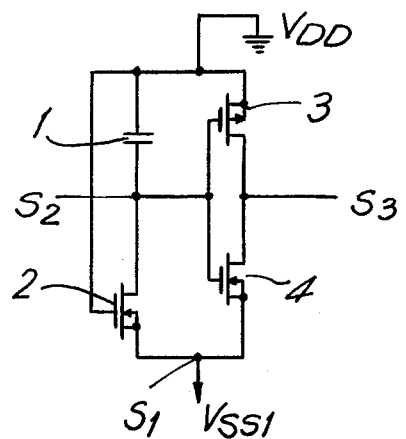
FIG. 1 is a detection circuit for an electronic timepiece of the prior art.

FIG. 1 shows a prior art circuit for detecting the condition of the power supply. This circuit is comprised of a capacitor 1 connected in series with the source/-drain terminal of an N-channel MOS transistor 2 across terminals for a power supply indicated as $V_{DD}$ and $V_{SS1}$. An inverter comprised of a complementary P-channel MOS transistor 3 and N-channel MOS transistor 4 is also connected across the terminals $V_{DD}$, $V_{SS1}$ with common drains and the gates commonly connected to the junction between the capacitor 1 and the N-channel transistor 2. The power source terminals $V_{DD}$, $V_{SS1}$ are connected to a battery having a voltage $V_{SS1}$.

Figure 2:
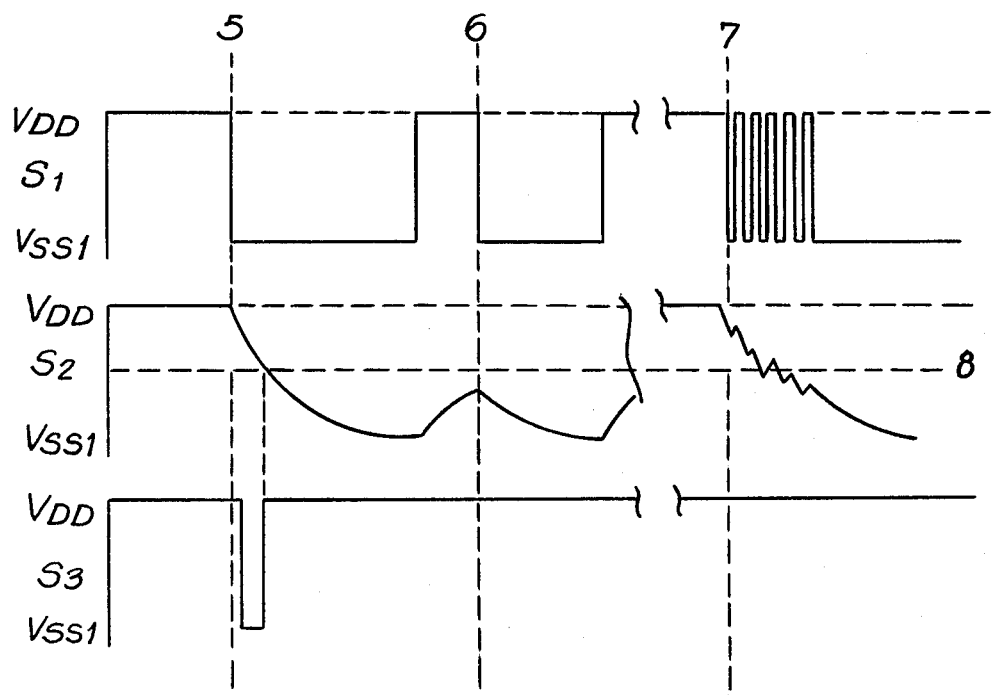
FIG. 2 illustrates timing waveforms associated with the circuit of FIG. 1.

The waveforms of FIG. 2 illustrate voltage levels at different positions in the circuit of FIG. 1 when the power sources is connected or not connected. $S_1$ is the voltage between the terminals $V_{DD}$ and $V_{SS1}$. $S_2$ is the voltage between the capacitor terminals, that is, the voltage across the capacitor 1 between the point S2 and ground $V_{DD}$. The output of the circuit is taken at the terminal S3, that is, a detection signal indicating the connection or non-connection of a battery source across the terminals $V_{DD}$, $V_{SS1}$. The ordinate of the graphs shows voltage level and the abscissa represents time.

The timing point 5 (FIG. 2) indicates a condition where the power source is normally applied. That is, the voltage across the terminals $V_{DD}$, $V_{SS1}$ goes from ground level to the level $V_{SS1}$. Negative values are indicated (FIG. 2) relative to ground. Thus, the signal S1 goes to the level $V_{SS1}$ and the signal S2 gradually approaches the level of the signal S1 with a curve which is characteristic of the time constant determined by the capacitor 1 and the resistance of the N-channel MOS transistor 2 through which the capacitor 1 is charged when the power source is connected across the terminals $V_{DD}$, $V_{SS1}$.

At the timing point 5, the level of the signal S3 goes low after a slight delay, that is, negative, because the signal S2 has not yet changed and is at the level $V_{DD}$. However, when the level of the signal S2 increases over the logical threshold level of the P-channel MOS transistor 3 and N-channel MOS transistor 4 of the inverter, the logic level of the signal S3 is inverted, that is, the level of the signal S3 goes high and is again at the level $V_{DD}$. Thus, when the output signal S3 goes low and then returns to its original state $V_{DD}$, as a pulse, it indicates that the battery power source is properly applied. The delay in the pulse S3 occurs because at the instant of applying the battery, there is insufficient current available to drive the inverter transistors 3, 4.

The timing point 6 (FIG. 2) indicates a condition where the power supply is applied just after it has been turned OFF. Thus, the signal $S_1$, which was at the level $V_{SS1}$, returns to the level $V_{DD}$ and then at timing point 6 is returned to the level $V_{SS1}$. When this sequence 6 is returned to the level $V_{SS1}$. When this sequence occurs the level of the output S3 remains high, at $V_{DD}$ throughout the entire sequence, because the level of the signal S2, indicating the charge on the capacitor 1, at timing point 6 is still lower, that is, more negative than the level 8 which is the logical threshold voltage of the inverter pair of transistors 3,4. Thus, the inverter does not switch over and S3 is constant. Therefore, with the sequence of disconnecting and reapplying the power supply, it is impossible to detect by an output signal S3 whether the power source is applied or not applied.

At timing point 7 (FIG. 2) a condition of chattering is shown caused at the contacts of the battery when the power source is applied. Under this condition, the level of the signal S2 approaches the level $V_{SS1}$ gradually in a step every time the voltage is applied. However, the P-channel MOS transistor 3 and N-channel MOS transistor 4 do not operate because repeatedly the voltage applied to them is not yet sufficient before the chattering interrupts the supply. Therefore, the level of the signal S3 remains at $V_{DD}$. Immediately following the condition where the voltage is applied steadily and sufficiently to the MOS transistors 3,4, the level of voltage S2 on the capacitor 1 is already higher than the logical threshold level 8 and approaches $V_{SS1}$. Therefore, in this condition the level of the signal S3 cannot change.

As stated above, in a detection circuit for an electronic timepiece of the prior art for detecting the application of the power source, as the level of the signal S3 cannot change under the conditions at the timing points 6 and 7, it is not possible to detect whether the power source is applied or not. Therefore, the prior art detection circuit for an electronic timepiece lack reliability. Further, in the prior art circuit, it is also impossible to detect the state of an oscillator circuit with accuracy because the conventional prior art detecting circuit does not detect whether there is an oscillation state or not but only detects the application of the power source or non-application of the power source.

The detection circuit for an electronic timepiece in accordance with the invention eliminates the defficiencies of the prior art circuit and an object of the invention is to provide a detection circuit for an electronic timepiece which can detect the conditions of power application or oscillation within the timekeeping circuits with accuracy.

FIG. 3 illustrates an detection circuit for an electronic timepiece in accordance with the invention and comprises P-channel MOS transistors 10, 11, 13, N-channel MOS transistors 9, 14, 15, and a capacitor 12. The voltages applied in this circuit are negative (FIG. 4) with respect to the ground terminal $V_{DD}$. $V_{SS2}$ is a negative potential which is substantially twice the value of $V_{SS1}$, the battery voltage. $V_{SS2}$ is a voltage boosted by a doubler booster circuit, for example, having two capacitors which are connected in series and in parallel alternately across the battery in the known manner. The booster circuit is not shown herein as it is well known in the art. The output of the booster circuit (not shown) is indicated in FIG. 4 by the graph identified as $S_7$. As indicated in FIG. 4, and described more fully hereinafter, the booster circuit (not shown) becomes operative only when the battery of potential $V_{SS1}$ is applied in the timepiece. Thus, the boosted voltage $V_{SS2}$, which is approximately equal to twice $V_{SS1}$, is not available unless the battery has been properly applied to the circuit.

In particular, at the time of applying the battery power source, the booster circuit is not yet fully operative and $V_{SS2}$ and $V_{DD}$ are substantially at the same level. Further, when in normal operation, the booster circuit relies on a normal functioning oscillator circuit for proper performance in switching the two capacitors alternately. Thus, when the oscillator stops, the level $S_7$ of the booster output is more negative than that of the battery $V_{SS}$ but rapidly approaches the level $V_{DD}$. As stated, this results because a necessary clock signal to the booster circuit is derived from the oscillator circuit and the clock signal ceases when oscillation ceases.

The capacitor 12 is connected in series with the N-channel transistor 15 across the boosted power supply $V_{DD}$-$V_{SS2}$. The P-channel transistor 11 is in parallel with the capacitor 12. Accordingly, when the P-channel transistor 11 is conductive, the capacitor 12 cannot be charged, but when the P-channel transistor 11 is non-conductive and the N-channel transistor 15 is conductive, the capacitor 12 can charge through the transistor 15 as indicated by the signal $S_5$. As in FIG. 1, the charge on the capacitor 12 is applied to the input of an inverter comprised of complementary channel transistors 13, 14 such that the output $S_6$ of the inverter 13, 14 is indicative of the charging of the capacitor 12.

The state of the P-channel transistor 11 is determined by the output of another inverter, comprising the complementary transistors 9, 10, which is responsive to the difference in voltage levels between the signals $S_8$ and $S_7$, that is, between $V_{SS1}$ and $V_{SS2}$. In particular, using the above characteristics, detection whether the power source is properly applied or not, or the oscillator is oscillating or not, is based on whether the magnitude of voltage from the booster circuit $V_{SS2}$ is greater than the magnitude of voltage from the battery $V_{SS1}$. The inverter circuit comprising P-channel MOS transistor 10 and N-channel MOS transistor 9 is constructed to invert the output logic level when the gate and source of the N-channel transistor 9 are almost at the same potential. Accordingly, at the condition $|V_{DD}\text{-}V_{SS2}| > |V_{DD}\text{-}V_{SS1}|$, $S_4$ is $V_{DD}$ and at the condition $|V_{DD}\text{-}V_{SS2}| < |V_{DD}\text{-}V_{SS1}|$, $S_4$ is $V_{SS1}$.

The other inverter circuit comprising complementary P-channel MOS transistor 13 and N-channel MOS transistor 14 is constructed to have a logical threshold level for inverting the logic level of the output of $V_{SS1}/2$.

When the power source is applied, $V_{SS2}$ and $V_{DD}$ are almost at the same level. Further, at the time of applying the battery voltage, $V_{SS1}$, the terminal $V_{SS1}$ and the battery voltage are substantially at the same level. The output $S_4$ of the inverter comprising transistors 9, 10 becomes $V_{SS1}$ because $|V_{DD}\text{-}V_{SS2}| < |V_{DD}\text{-}V_{SS1}|$. Accordingly, the P-channel MOS transistor 11 is ON, that is, conductive, and the N-channel MOS transistor 15 is OFF, that is, non-conductive. The signal $S_5$ is at the level $V_{DD}$ and the signal $S_6$, with a delay as explained above, is at the level $V_{SS1}$ because the oscillator, which controls the voltage booster, has not yet started. After that, the oscillation circuit begins to operate and further the voltage booster circuit also begins to operate. Thereby, the signal $S_7$ and $V_{SS2}$ approach a level which is double the level $V_{SS1}$, that is, $V_{SS2}$ approximately equals $2V_{SS1}$. This is a condition where $|V_{DD}\text{-}V_{SS2}| > |V_{DD}\text{-}V_{SS1}|$.

At this time, the level of the signal $S_4$ changes from $V_{SS1}$ to $V_{DD}$. Then the P-channel MOS transistor 11 is turned OFF; the N-channel MOS transistor 15 is ON. The capacitor 12 now charges through the transistor 15 until the signal $S_5$ is at the level $V_{SS2}$ which is approximately twice the battery voltage. The output signal $S_6$ reverts from the level $V_{SS1}$ to the level $V_{DD}$. Thus, application of the battery has resulted in operation of the booster circuit as a result of operation of the oscillator circuit. As a result, a pulse $S_6$ is produced indicating that the battery has been properly applied. This operation is represented in FIG. 4 at the timing point 16 where it is shown that the power is properly applied in the normal manner.

At the timing point 17, it is illustrated that the power source is reapplied just after the power supply has been turned OFF. Timing point 18 shows a condition where chattering is caused at the contacts of the battery when the power source is applied. The signal pulse $S_6$ is delayed until chattering has ended, as explained above. Regardless of the conditions at the timing points 16, 17 and 18, when the power source is applied, the voltage levels in the circuit initially meet the conditions $|V_{DD}\text{-}V_{SS2}| < |V_{DD}\text{-}V_{SS1}|$, and after oscillation has begun the voltage conditions are $|V_{DD}\text{-}V_{SS2}| > |V_{DD}\text{-}V_{SS1}|$. As a result, it is possible to detect the conditions of applying the power source, or the occurrence of oscillation, with accuracy at all of these conditions as indicated by the output signal $S_6$.

As stated above, in accordance with the invention, it is possible to detect a condition of oscillation stoppage with certainty and further the circuit requires very little current consumption. Therefore, it is most suitable as a detection circuit for an electronic timepiece having a small battery.

Figure 5:
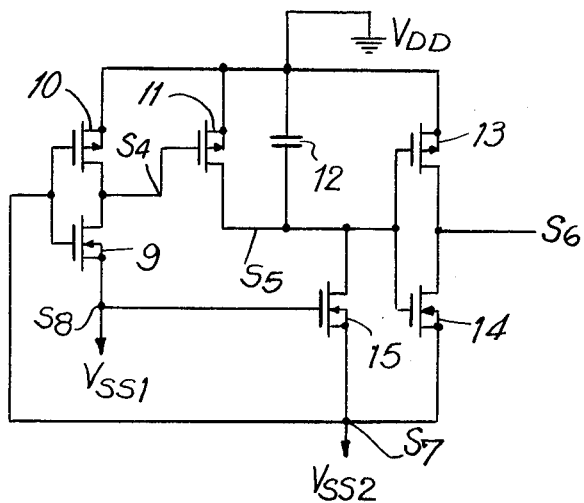
FIGS. 5 and 6 are alternative embodiments of a detection circuit for an electronic timepiece in accordance with the invention.

FIG. 5 illustrates an alternative embodiment of a detection circuit for an electronic timepiece in accordance with the invention. In FIG. 5, the source of the N-channel MOS transistor 14 is not connected to the battery supply $V_{SS1}$ as shown in FIG. 3 but is connected to the voltage doubler supply $V_{SS2}$. As a result, the output signal $S_6$, which is the detection signal, swings between the levels $V_{DD}$ and $V_{SS2}$ rather than between $V_{DD}$ and $V_{SS1}$ as shown in FIG. 4. Otherwise, the construction and performance of the circuit of FIG. 5 is the same as for the circuit of FIG. 3.

Figure 6:
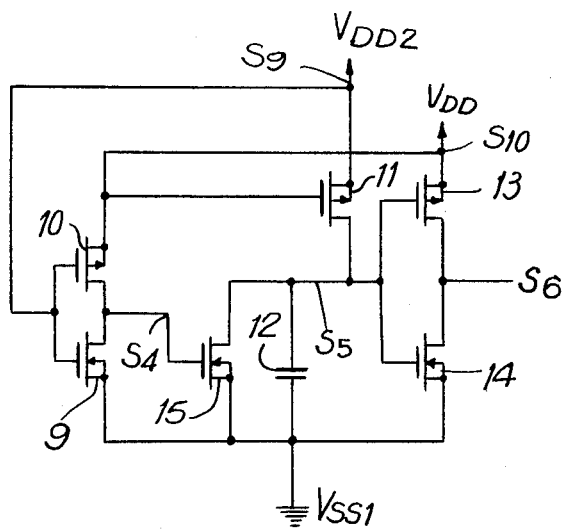

FIG. 6 is another alternative embodiment of a detection circuit for an electronic timepiece in accordance with the invention wherein the location of the P- and N-channel MOS transistors 11, 15, relative to the capacitor 12 are interchanged as compared to FIG. 3. In this embodiment, the power source is provided as follows: $V_{SS1}$ is 0 volts as ground, $V_{DD2}$ is $+1.5$ volts reduced from a battery voltage of 3.0 volts, and $V_{DD}$ is 0.75 volts divided from the battery voltage of 3.0 volts. The circuit of FIG. 6 operates on the same principles as that of FIG. 3 and therefore a detailed description of the operation of the circuit of FIG. 6 is omitted here.

Embodiments of detection circuit for an electronic timepieces in accordance with the invention wherein a voltage reduction is used rather than voltage boosting as previously described is now presented using the same circuits diagrams of FIGS. 3, 5 and 6 and waveforms of FIG. 4.

Figure 7:
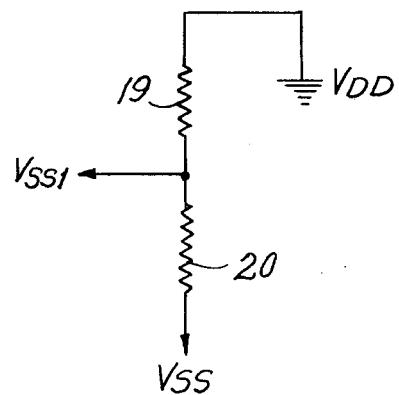
FIG. 7 is a voltage divider circuit for use with a detection circuit for an electronic timepieces in accodance with the invention.

However, for purposes of the embodiments using voltage reduction, the circuit of FIG. 7 redefines the voltage applicable in the FIGS. 3–6. In FIG. 7 a battery voltage $V_{SS}$ is divided between resistances 19, 20 and the resistances are selected such that the relationship between $V_{DD}$ and $V_{SS}$ is defined as follows: $|V_{DD}\text{-}V_{SS1}| \times 4 = |V_{DD}\text{-}V_{SS}|$. The potential at terminal $V_{SS1}$ (FIG. 7) is applied at the point $S_8$ of FIG. 3 and as stated represents approximately ¼ of the battery voltage. A negative potential $V_{SS2}$ is provided by dividing the battery voltage $V_{SS}$ in half by a voltage reduction circuit having two capacitors which are connected in series and in parallel by turns in the known manner. Such a voltage reduction circuit is not shown in this application as it is well known and needs no further description here. The voltage $V_{SS2}$ is applied at the terminal identified as $S_7$. Thus, in the embodiment using voltage reduction, $V_{SS2}$ is one-half of the battery voltage and $V_{SS1}$ is approximately one-quarter of the battery voltage in magnitude.

Thus, when the timepiece circuits are fully operational, that is, the timepiece oscillator operates so that the voltage reduction circuit with the alternating capacitors is functional, the relationship between $V_{SS2}$ and $V_{SS1}$ is the same as in the previously described embodiments using a voltage boosting circuit. Accordingly, the circuits of FIGS. 3, 5, and 6 using voltage reduction operate in the same manner as the circuits previously described relative to the same Figures using a voltage booster circuit.

In particular, the characteristics of the voltage reduction circuit are as follows. At the time of applying the power source, $V_{SS2}$ and $V_{DD}$ are substantially at the same level. When during normal operation, the oscillator stops, the level of $V_{SS2}$ is higher than that of $V_{SS1}$ in magnitude and then approaches the level $V_{DD}$ because the clock signal from the oscillator which is applied to the voltage reduction circuit also stops. Thus, using the above characteristics, the detection circuit in accordance with the invention provides a detection of the condition that the power source is applied or not applied or that oscillation is ongoing or stopped by evaluating the condition as above, namely, $|V_{DD}-V_{SS2}| > |V_{DD}-V_{SS1}|$.

With reference to FIG. 3 and FIG. 7, one inverter circuit is constructed with a complementary P-channel MOS transistor 10 and N-channel MOS transistor 9. This inverter is constructed to invert the logic level when the gate and source of the N-channel transistor 9 are substantially at the same potential. Accordingly, at the condition of $|V_{DD}-V_{SS2}| > |V_{DD}-V_{SS1}|$, $S_4$ is $V_{DD}$ and at the condition of $|V_{DD}-V_{SS2}| < |V_{DD}-V_{SS1}|$, $S_4$ is $V_{SS1}$.

The other inverter circuit comprising complementary P-channel MOS transistor 13 and N-channel MOS transistor 14 is constructed to have a logical threshold level for inverting the logic level of the output of $V_{SS1}/2$.

When the power source is applied, $V_{SS2}$ and $V_{DD}$ are almost at the same level. Further, at the time of applying the battery voltage, $V_{SS1}$, the terminal $V_{SS1}$ and the battery voltage are substantially at the same level. The output S4 of the inverter comprising transistors 9, 10 becomes $V_{SS1}$ because $|V_{DD}-V_{SS2}| < |V_{DD}-V_{SS1}|$. Accordingly, the P-channel MOS transistor 11 is ON, that is, conductive, and the N-channel MOS transistor 15 is OFF, that is, non-conductive. The signal S5 is at the level $V_{DD}$ and the signal S6 is at the level $V_{SS1}$ because the oscillator, which controls the voltage reduction circuit, has not yet started. After that, the oscillation circuit begins to operate and further the voltage reduction circuit also begins to operate. Thereby, the signal S7 and $V_{SS2}$ approach a level which is double the level $V_{SS1}$, that is, $V_{SS2}$ approximately equals $2V_{SS1}$. This is a condition where $|V_{DD}-V_{SS2}| > |V_{DD}-V_{SS1}|$.

At this time, the level of the signal S4 changes from $V_{SS1}$ to $V_{DD}$. Then the P-channel MOS transistor 11 is turned OFF the N-channel MOS transistor 15 is ON. The capacitor 12 now charges through the transistor 15 until the signal S5 is at the level $V_{SS2}$ which is approximately twice the voltage $V_{SS1}$. The output signal S6 reverts from the level $V_{SS1}$ to the level $V_{DD}$. Thus, application of the battery has resulted in operation of the reduction circuit as a result of operation of the oscillator circuit. As a result, a pulse $S_6$ is produced indicating that the battery has been properly applied. This operation is represented in FIG. 4 at the timing point 16 where it is shown that the power is properly applied in the normal manner.

At the timing point 17, it is illustrated that the power source is reapplied just after the power supply has been turned OFF. Timing point 18 shows a condition where chattering is caused at the contacts of the battery when the power source is applied. Regardless of the conditions at the timing points 16, 17 and 18, when the power source is applied, the voltage levels in the circuit initially meet the conditions $|V_{DD}-V_{SS2}| < |V_{DD}-V_{SS1}|$, and after oscillation has begun the voltage conditions are $|V_{DD}-V_{SS2}| > |V_{DD}-V_{SS1}|$. As a result, it is possible to detect the conditions of applying the power source, or the occurrence of oscillation, with accuracy at all of these conditions as indicated by the output signal $S_6$.

As stated above, in accordance with the invention, it is possible to detect a condition of oscillation stoppage with certainty and further the circuit requires very little current consumption. Therefore, it is most suitable as a detection circuit for an electronic timepiece having a small battery.

FIG. 5 illustrates an alternative embodiment of a detection circuit for an electronic timepiece in accordance with the invention. In FIG. 5, the source of the N-channel MOS transistor 14 is not connected to the voltage supply $V_{SS1}$ as shown in FIG. 3 and FIG. 7 but is connected to the reduced voltage supply $V_{SS2}$. As a result, the output signal $S_6$, which is the detection signal, swings between the levels $V_{DD}$ and $V_{SS2}$ rather than between $V_{DD}$ and $V_{SS1}$ as shown in FIG. 4. Otherwise, the construction and performance of the circuit of FIGS. 5 and 7 is the same as for the circuit of FIGS. 3 and 7.

FIG. 6 and FIG. 7 is another alternative embodiment of a detection circuit for an electronic timepiece in accordance with the invention wherein the location of the P- and N-channel MOS transistors 11, 15, relative to the capacitor 12 are interchanged as compared to FIGS. 3 and 7. In this embodiment, the power source is provided as follows: $V_{SS1}$ is 0 volts as ground. $V_{DD2}$ is $+1.5$ volts reduced from a battery voltage of 3.0 volts, and $V_{DD}$ is 0.75 volts divided from the battery voltage of 3.0 volts. The circuit of FIGS. 6 and 7 operates on the same principles as that of FIGS. 3 and 7 and therefore a detailed description of the operation of the circuit of FIG. 6 is omitted here.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In an electronic timepiece comprising an oscillator circuit outputting a standard frequency signal, a divider network dividing down said standard frequency signal to provide timekeeping data, display means for displaying at least said timekeeping data, a battery, said battery when applied, providing power to operate said electronic timepiece, a voltage circuit for boosting the voltage out of said battery, operation of said voltage boosting circuit being subject to input thereto of a frequency signal derived from operation of said oscillator circuit, the improvement therein comprising:

a detection circuit for detecting the application of said battery in said timepiece, said detection circuit including:

a capacitor having first and second terminals;

a first switching element in parallel with said capacitor, said first switching element when OFF being an open circuit and when ON being of low resistance;

a second switching element electrically connected at one end to said second capacitor terminal, boosted voltage terminals of said voltage circuit being electrically connected respectively to said first capacitor terminal and to the other end of said second switching element;

circuit means operating in a first mode turning said first switching element OFF and said second switching element ON when said boosted output at said voltage circuit terminals exceeds the voltage of said battery, and in a second mode turning said first switching element ON and said second switching element OFF when said output at said voltage circuit terminals is less than said battery voltage, said capacitor charging through said second switching element in said first mode, charging of said capacitor to a selected level in said first mode causing an output signal indicative of battery application and operation of said oscillator circuit.

2. A detection circuit as claimed in claim 1, wherein said circuit means for operating in said first and second modes includes a first inverter circuit, and said first switching element is a first P-channel MOS transistor, said second switching element is a first N-channel MOS transistor, said first inverter circuit comprising a complementary second P-channel transistor and a second N-channel transistor, the gate electrode of said first P-channel transistor being connected to the drain electrodes of said first inverter circuit, the source electrodes of said second P-channel transistor and said second N-channel transistor being connected across said battery, the gate electrode of said first inverter circuit being connected to the lower potential terminal of said booster voltage circuit, and the gate electrode of said first N-channel transistor being connected to the lower potential terminal of said battery, the higher potential terminal of said booster voltage circuit being connected with the higher potential terminal of said battery.

3. A detection circuit as claimed in claim 1, wherein said circuit means operating in said first and second modes includes a first inverter, and said first switching element is a first N-channel MOS transistor, said second switching element is a first P-channel MOS transistor, the gate electrode of said first N-channel transistor being connected to the drain electrodes of said first inverter circuit, said first inverter circuit being constructed of a second N-channel transistor and a second P-channel transistor, the source electrodes of said second P-channel transistor and said second N-channel transistor being connected across said battery, the gate electrode of said inverter circuit being connected to the higher potential terminal of said booster voltage circuit, and the gate electrode of said first P-channel transistor being connected to the higher potential terminal of said battery, the lower potential terminal of said booster voltage circuit being connected with the lower potential terminal of said battery.

4. A detection circuit as claimed in claim 2 or 3, and further comprising a second inverter circuit comprised of a third N-channel transistor and a third P-channel transistor, the sources of said second inverter transistors being connected across one of said battery and said voltage circuit output terminals, the gate of said second inverter being connected between said capacitor and said second switching element, the output of said inverter changing level and providing said output signal indication when said capacitor has charged to said selected level.

5. In an electronic timepiece comprising an oscillator circuit outputting a standard frequency signal, a divider network dividing down said standard frequency signal to provide time-keeping data, display means for displaying at least said time-keeping data, a battery, said battery when applied, providing power to operate said electronic timepiece, a voltage circuit for reducing the voltage out of said battery, operation of said voltage reducing circuit being subject to input thereto of a frequency signal derived from operation of said oscillator circuit, the improvement therein comprising:

a detection circuit for detecting the application of said battery in said timepiece, said detection circuit including:

a capacitor having first and second terminals;

a first switching element in parallel with said capacitor, said first switching element when OFF being an open circuit and when ON being of low resistance;

a second switching element electrically connected at one end to said second capacitor terminal, reduced voltage terminals of said voltage circuit being electrically connected respectively to said first capacitor terminal and to the other end of said second switching element;

circuit means operating in a first mode turning said first switching element OFF and said second switching element ON when said reduced output at said voltage circuit terminals exceeds a selected divided voltage of said battery, and in a second mode turning said first switching element ON and said second switching element OFF when said output at said voltage circuit terminals is less than said selected divided battery voltage, said capacitor charging through said second switching element in said first mode, charging of said capacitor to a selected level in said first mode causing an output signal indicative of battery application and operation of said oscillator circuit.

6. A detection circuit as claimed in claim 5, wherein said circuit means for operating in said first and second modes includes a first inverter circuit, and said first switching element is a first P-channel MOS transistor, said second switching element is a first N-channel MOS transistor, said first inverter circuit comprising a complementary second P-channel transistor and a second N-channel transistor, the gate electrode of said first P-channel transistor being connected to the drain electrodes of said first inverter circuit, the source electrodes of said second P-channel transistor and said second N-channel transistor being connected across said selected divided battery voltage, the gate electrode of said first inverter circuit being connected to the lower potential terminal of said voltage reduction circuit, and the gate electrode of said first N-channel transistor being connected to the lower potential terminal of said selected divided battery voltage, the higher potential terminal of said voltage reduction circuit being connected with the higher potential terminal of said selected divided battery voltage.

7. A detection circuit as claimed in claim 5, wherein said circuit means operating in said first and second modes inlcudes a first inverter, and said first switching element is a first N-channel MOS transistor, said second switching element is a first P-channel MOS transistor, the gate electrode of said first N-channel transistor being connected to the drain electrodes of said first inverter circuit, said first inverter circuit being constructed of a complementary second N-channel transistor and a second P-channel transistor, the source electrodes of said second P-channel transistor and said second N-channel transistor being connected across said selected divided battery voltage, the gate electrode of said inverter circuit being connected to the higher potential terminal of said reduction voltage circuit, and the gate electrode of said first P-channel transistor being connected to the higher potential terminal of said selected divided battery voltage, the lower potential terminal of said voltage reduction circuit being connected with the lower potential terminal of said selected divided battery voltage.

8. A detection circuit as claimed in claim 6 or 7, and further comprising a second inverter circuit comprised of a third N-channel transistor and a third P-channel transistor, the sources of said second inverter transistors being connected across one of said selected divided battery voltage and said voltage circuit output terminals, the gate of said second inverter being connected between said capacitor and said second switching element, the output of said inverter changing level and providing said output signal indication when said capacitor has charged to said selected level.

* * * * *